(12) United States Patent
Uchiyama et al.

(10) Patent No.: US 8,368,067 B2
(45) Date of Patent: Feb. 5, 2013

(54) OXIDE SEMICONDUCTOR DEVICE WITH OXIDE SEMICONDUCTOR LAYERS OF DIFFERENT OXYGEN CONCENTRATIONS AND METHOD OF MANUFACTURING THE SAME

(75) Inventors: Hiroyuki Uchiyama, Musashimurayama (JP); Tetsufumi Kawamura, Kodaira (JP); Hironori Wakana, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 241 days.

(21) Appl. No.: 12/633,577

(22) Filed: Dec. 8, 2009

(65) Prior Publication Data

US 2010/0140614 A1 Jun. 10, 2010

(30) Foreign Application Priority Data

Dec. 9, 2008 (JP) .................................. 2008-312814

(51) Int. Cl.
*H01L 29/10* (2006.01)
(52) U.S. Cl. .............. 257/43; 257/59; 257/72; 257/103; 257/E29.273; 257/E29.296
(58) Field of Classification Search .................... 257/43, 257/59, 72, 103, E29.273, E29.296
See application file for complete search history.

(56) References Cited

U.S. PATENT DOCUMENTS

| | | | |
|---|---|---|---|
| 6,670,953 B1 * | 12/2003 | Ozawa ........................ | 345/211 |
| 2006/0113539 A1 | 6/2006 | Sano et al. | |
| 2006/0113565 A1 | 6/2006 | Abe et al. | |
| 2007/0054507 A1 | 3/2007 | Kaji et al. | |
| 2008/0038882 A1 * | 2/2008 | Takechi et al. ............... | 438/151 |
| 2008/0197350 A1 * | 8/2008 | Park et al. ....................... | 257/43 |
| 2008/0296568 A1 * | 12/2008 | Ryu et al. ....................... | 257/43 |
| 2009/0065771 A1 | 3/2009 | Iwasaki et al. | |
| 2009/0261325 A1 | 10/2009 | Kawamura et al. | |

FOREIGN PATENT DOCUMENTS

| | | |
|---|---|---|
| JP | 2006-165532 A | 6/2006 |
| JP | 2006-173580 A | 6/2006 |
| JP | 2007-073699 A | 3/2007 |
| JP | 2007-250983 A | 9/2007 |

OTHER PUBLICATIONS

Park et al., "Improvements in the device characteristics of amorphous indium gallium zinc oxide thin-film transistors by Ar plasma treatment", Applied Physics Letters, vol. 90, 2007, pp. 262106-1 to 262106-3.

* cited by examiner

*Primary Examiner* — Andy Huynh
(74) *Attorney, Agent, or Firm* — Miles & Stockbridge P.C.

(57) ABSTRACT

A phenomenon of change of a contact resistance between an oxide semiconductor and a metal depending on an oxygen content ratio in introduced gas upon depositing an oxide semiconductor film made of indium gallium zinc oxide, zinc tin oxide, or others in an oxide semiconductor thin-film transistor. A contact layer is formed with an oxygen content ratio of 10% or higher in a region from a surface, where the metal and the oxide semiconductor are contacted, down to at least 3 nm deep in depth direction, and a region to be a main channel layer is further formed with an oxygen content ratio of 10% or lower, so that a multilayered structure is formed, and both of ohmic characteristics to the electrode metal and reliability such as the suppression of threshold potential shift are achieved.

12 Claims, 18 Drawing Sheets

MEMORY    DISPLAY DRIVING

MEMORY    DISPLAY DRIVING

FOR ORGANIC EL ELEMENT DRIVING       FOR TOUCH PANEL (SENSOR)

OXIDE SEMICONDUCTOR DEVICE WITH OXIDE SEMICONDUCTOR LAYERS OF DIFFERENT OXYGEN CONCENTRATIONS AND METHOD OF MANUFACTURING THE SAME

CROSS-REFERENCE TO RELATED APPLICATION

The present application claims priority from Japanese Patent Application No. JP 2008-312814 filed on Dec. 9, 2008, the content of which is hereby incorporated by reference into this application.

TECHNICAL FIELD OF THE INVENTION

The present invention relates to an oxide semiconductor device and a technique of manufacturing the same.

BACKGROUND OF THE INVENTION

In recent years, a display device has been flat-surface display device from a display using a cathode-ray tube toward a flat-surface display device called flat panel display (FPD) such as a liquid crystal panel and a plasma display. In the liquid crystal panel, as an element relating to pixel switching by liquid crystals, a thin-film transistor made of a—Si (amorphous silicon) or poly-silicon is used for a switching element. Recently, an FPD using organic Electro-Luminescence (EL) has been expected aiming for further larger area size and flexibility. However, since the organic EL display is a spontaneous light emitting device in which an organic semiconductor layer is driven to obtain direct light emission, a property of a current-driving device is required for a thin-film transistor which is different from conventional liquid crystal displays. Meanwhile, it is also required to provide new functions such as further larger area size and flexibility for a future FPD, and therefore, it is required to provide not only high performance as an image display device but also compatibility to a large-area process and compatibility to a flexible substrate. Based on such a background, using a transparent oxide semiconductor whose band gap is about 3 eV has been studied for the thin-film transistor for the display device in recent years, and usages for a thin film memory, an RFID, a touch panel, and others in addition to the display device have also been expected.

While zinc oxide or tin oxide has been known as the transparent oxide transistor for a long time, a thin-film transistor using IGZO (complex oxide composed of indium oxide, gallium oxide, and zinc oxide) is disclosed, IGZO being used as a material capable of suppressing threshold potential shift which is a bad point of the zinc oxide, in Japanese Patent Application Laid-Open Publication No. 2006-165532 (Patent Document 1), paragraphs [0009] to [0052] and Japanese Patent Application Laid-Open Publication No. 2006-173580 (Patent Document 2), paragraphs [0009] to [0032] (see Patent Documents 1 and 2), and a possibility of achieving a new semiconductor device by a thin-film process has been expected in recent years. More particularly, subthreshold swings of IGZO and ZTO (complex oxide composed of zinc oxide and tin oxide) better than that of poly-silicon have been confirmed, and it is considered that they are used to not only display application but also device application requiring very low voltage operation and/or very low power consumption.

SUMMARY OF THE INVENTION

As mentioned above, a thin-film transistor using an oxide semiconductor for a channel layer has sufficient properties as a switching and current-driving device for a liquid crystal display or an organic EL display in terms of mobility of about 1 to 50 $cm^2$/Vs and an on/off ratio of $10^6$ or higher. Further, since a process at the room temperature such as sputtering deposition is possible for the transistor, there are multiple advantages such as easiness of flexibility. That is, these properties show that it is possible to achieve a thin-film transistor having the same level of high quality with that of poly-silicon that requires a high-temperature process by a room-temperature process such as a sputtering method at a low cost. More particularly, since application as a current-driving device has been required for an organic EL display expected as an spontaneous light emission and high-definition display in recent years, large reliabilities in its durability and suppression of its threshold potential shift are required. For example, since a threshold potential shift of a—Si that has been conventionally and mainly used for a pixel switching of a liquid crystal display is largely over about 2 V which is easily controlled by a correction circuit, it is considered to be difficult to use the a—Si for a thin-film transistor for organic EL.

However, in an oxide semiconductor to which studies on an interface of semiconductor/electrode have not been developed compared with that of a Si semiconductor, there is an issue that good contact property cannot be obtained because of control of the interface of the oxide semiconductor and the electrode or differences in work function between the oxide semiconductor and metal materials, and properties included in the oxide semiconductor are not fully used. FIGS. 1 and 2 are diagrams illustrating a relation of a contact resistance and an oxygen content ratio with respect to argon gas and a relation of a threshold potential shift and the oxygen content ratio, respectively, when an oxide semiconductor channel layer is formed of IGZO by sputtering deposition. When the oxygen content ratio is 10% or higher, while the contact property is good, the threshold potential shift is large. On the other hand, when the oxygen content ratio is 5% or lower, while the threshold potential shift is good, the contact resistance is high, and therefore, it is difficult to balance these competing issues.

Also, there is a method of using indium-tin complex oxide (ITO), aluminum-doped zinc oxide (AZO), or gallium-doped zinc oxide (GZO) whose work functions are close to that of the oxide semiconductor for improving the contact property. However, since the oxide semiconductor layer being the channel layer is formed of a complex oxide mainly made of indium or zinc oxide, a composition of the layer is changed at an interface contacting to these transparent conductive film materials, and there are possibilities of affecting a semiconductor property and causing a property change by energization, and therefore, the method is not necessarily good.

Further, a method of improving the contact property by exposing a surface of the oxide semiconductor to which electrodes are formed to plasma containing oxygen or hydrogen, or high-energy rays is disclosed in J-S. Park et al., Applied Physics Letters, Vol. 90, 262106, 2007 (Non-Patent Document 1), Japanese Patent Application Laid-Open Publication No. 2007-250983, paragraphs [0018] to [0024] (Patent Document 3), Japanese Patent Application Laid-Open Publication No. 2007-073699, paragraphs [0016] to [0028] (Patent Document 4), and others in recent years, and an oxygen concentration in a vicinity of the surface can be increased by these methods. However, accurate oxygen concentration control is difficult because of difficulty of plasma control depending on an inside state of a vacuum chamber, and the exposure cannot be treated in a state before forming the oxide semiconductor layer because it is a surface process. That is, the treatment is possible if the transistor has a top-contact type thin-film transistor structure, and the treatment is impossible if the transistor has a bottom-contact type thin-film transistor structure.

A preferred aim of the present invention is, in an oxide semiconductor device, to provide an interface-control method achieving both prevention of deterioration of ohmic characteristics caused at an interface between an oxide semiconductor and a metal electrode and a high reliability such as a low threshold potential shift property which the oxide semiconductor essentially has, so that a good oxide semiconductor device is achieved.

The typical ones of the inventions disclosed in the present application will be briefly described as follows.

An oxide semiconductor device of the present invention uses the fact that the ohmic characteristics of the oxide semiconductor to the metal electrode change depending on a ratio of oxygen added to gas introduced upon depositing the oxide semiconductor. First, an oxide semiconductor layer having a relatively low oxygen content ratio (5% or lower) and having a property difficult to cause the threshold potential shift is formed in a region including a vicinity of a gate insulating film where a channel layer is formed, and an oxide semiconductor layer having a relatively high oxygen content ratio (10% or higher) is formed in a region at a depth of 3 to 10 nm from a portion contacting to a metal electrode, so that a multilayered structure of two or more layers is provided to achieve both a high reliability such as a low threshold potential shift property and ohmic contact characteristics. That is, an oxide semiconductor layer having a high oxygen concentration and a small contact resistance is used for the portion contacting with the metal electrode, and an oxide semiconductor layer having a low oxygen concentration and a small threshold potential shift is used for the oxide semiconductor layer including the vicinity of the gate insulating film where the channel layer is formed, so that both an improvement of the contact and a low threshold potential shift property can be achieved. The oxide semiconductor layer having a high oxygen concentration inserted for improving the ohmic contact can achieve good contact property when a thickness of forming a layer reacted with the metal is provided, and therefore, an effective thickness of about 3 to 10 nm is sufficient to exist, and it is required to optimize the thickness within the thickness range depending on a thickness of an oxide semiconductor channel layer required for a device to be used. Also, as one example of a preferable oxygen concentration in such a film, an oxygen concentration of the oxide semiconductor layer having a high oxygen concentration is $10^{21}$ atomic concentration or higher, and an oxygen concentration of the oxide semiconductor layer having a low oxygen concentration is below $10^{21}$ atomic concentration. More preferably, a difference of their concentrations is preferably about 10 times. Further, while each concentration in such a film is substantially uniform, the concentration is comparatively varied by a deposition condition. However, the variation is normally within about several hundred ppm range, and therefore, "substantially uniform concentration" defined in the present specification of the present application means a film in which the variation of the concentration is within several hundred ppm range. FIG. 3 illustrates configurations of an oxide semiconductor contact layer 4' and an oxide semiconductor channel layer 4 of the present invention in a bottom-gate top-contact thin-film transistor, and the oxide semiconductor layers having different oxygen concentrations from each other in the films as described above are used for the channel layer 4 on a gate oxide (insulating) film 3 side and the contact layer 4' on a source/drain electrode 5 side, respectively, so that a multilayered structure is provided. The contact layer 4' may be a single layer, a multilayered structure in which an oxygen concentration in each layer is changed, or a structure in which oxygen concentrations are gradedly changed from the electrode side toward the channel layer 4 side. Also, in a structure in which the contact layer 4' is provided in only a region right below the source/drain electrode 5, the effect is not changed.

The effects obtained by typical aspects of the present invention disclosed in the present application will be briefly described below.

As illustrated in FIGS. 1 and 2, in the condition of the high oxygen content ratio, although a good contact property is shown, the threshold potential shift is large. On the other hand, in the region of the low oxygen content ratio, although a good threshold potential shift is shown, the contact property is bad, and therefore, it is difficult to balance these two competing issues. Accordingly, FIGS. 4 and 5 illustrate states of the contact resistance and the threshold potential shift when applying the present invention of the present application to a multilayered structure in which, in an oxide semiconductor layer having a total thickness of 25 nm, an oxygen content ratio in an introduced gas is set to be 4% upon depositing the oxide semiconductor layer for a thickness of 20 nm in the vicinity of the gate insulating film, and the oxygen content ratio upon depositing the oxide semiconductor layer is changed for a thickness of 5 nm from a portion contacting with the source/drain electrode. For comparison, results of a conventional structure are also illustrated. Compared with the case of using a single oxide semiconductor channel layer having an oxygen content ratio of 20%, the threshold potential shift is significantly improved in the case of the multilayered structure as keeping a good contact resistance to the source/drain electrode. For comparison, in a manner opposite to the method of the present invention, a measurement is performed on an oxide semiconductor layer having the oxygen content ratio of 4% upon depositing the oxide semiconductor layer for the thickness of 5 nm of the layer contacting with the metal and an oxide semiconductor layer having the oxygen content ratio of 20% upon depositing the oxide semiconductor layer for the thickness of 20 nm of the main channel layer. A result of this measurement is different from that of the method of the present invention, and the result showed a very high contact resistance of almost 1 kΩ and the threshold potential shift could not be measured. Also from this point, the method of the present invention clearly improves the contact property between the electrode metal and the oxide semiconductor layer.

In addition, a difference between the method of the present invention and the method of the surface process with using plasma or high-energy rays described in the summary clearly appears in the distribution of the oxygen concentration in the oxide semiconductor layer as illustrated in FIG. 6. FIG. 6 illustrates a result of a SIMS (secondary ion mass spectrometry) detection detecting a region of 10% of an oxide semiconductor of 400 μm² to which Cs (cesium) ion is irradiated at an acceleration voltage of 3 keV and with 20 nA. That is, in the method of the plasma process, although the oxygen concentration can be increased only in the vicinity of the surface, it is rapidly decreased toward the depth direction, and therefore, the sufficient thickness required for the contact with the metal cannot be secured. Compared with this, in the formation of the multilayered structure by the present invention, the uniform high oxygen concentration is clearly secured through the whole contact layer of the thickness of 3 nm. The method is clearly effective for yield, product reliability, and securement of uniformity as a manufacturing technique also from this point.

According to the present invention, it is possible to effectively apply the mobility and low threshold potential shift property, which the oxide semiconductor essentially has, for a device.

BRIEF DESCRIPTIONS OF THE DRAWINGS

Figure 18:
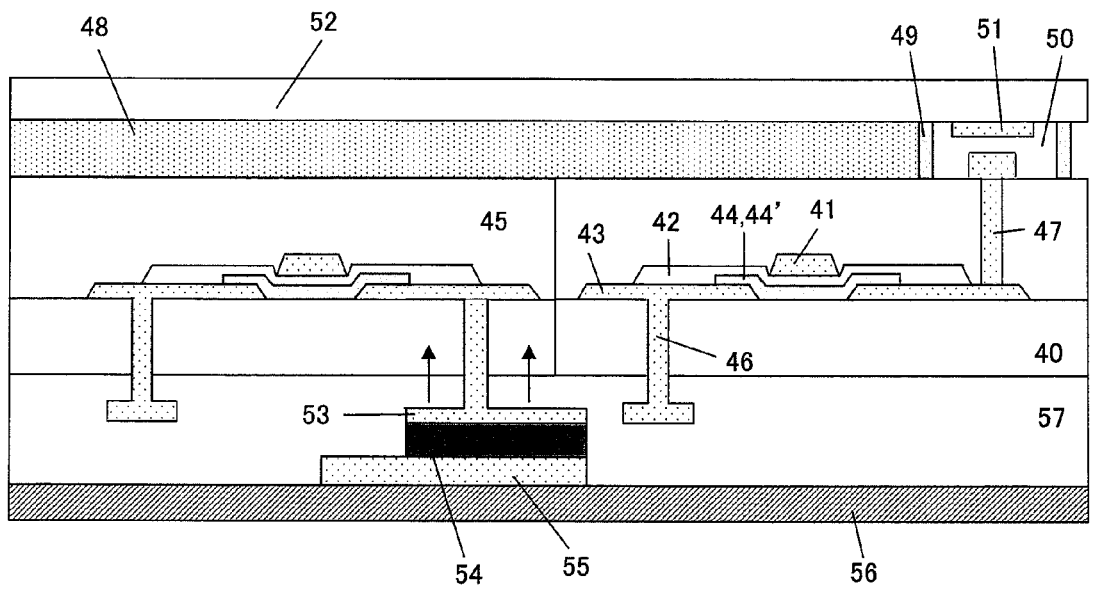

FIGS. 17A-17D are flow diagrams describing a structure of a touch panel (touch sensor) to which a bottom-gate bottom-contact oxide semiconductor thin-film transistor according to a third embodiment of the present invention and a method of manufacturing the same are applied; and FIG. 18 is a cross-sectional view describing a structure of a display in which a bottom-emission type organic EL element, the touch panel (touch sensor) to which the bottom-gate bottom-contact oxide semiconductor thin-film transistor according to the third embodiment of the present invention is applied, and a driving transistor for the EL element and the touch panel are integrated.

DESCRIPTIONS OF THE PREFERRED EMBODIMENTS

Hereinafter, embodiments of the present invention will be described in detail with reference to the accompanying drawings.

First Embodiment

Figure 1:
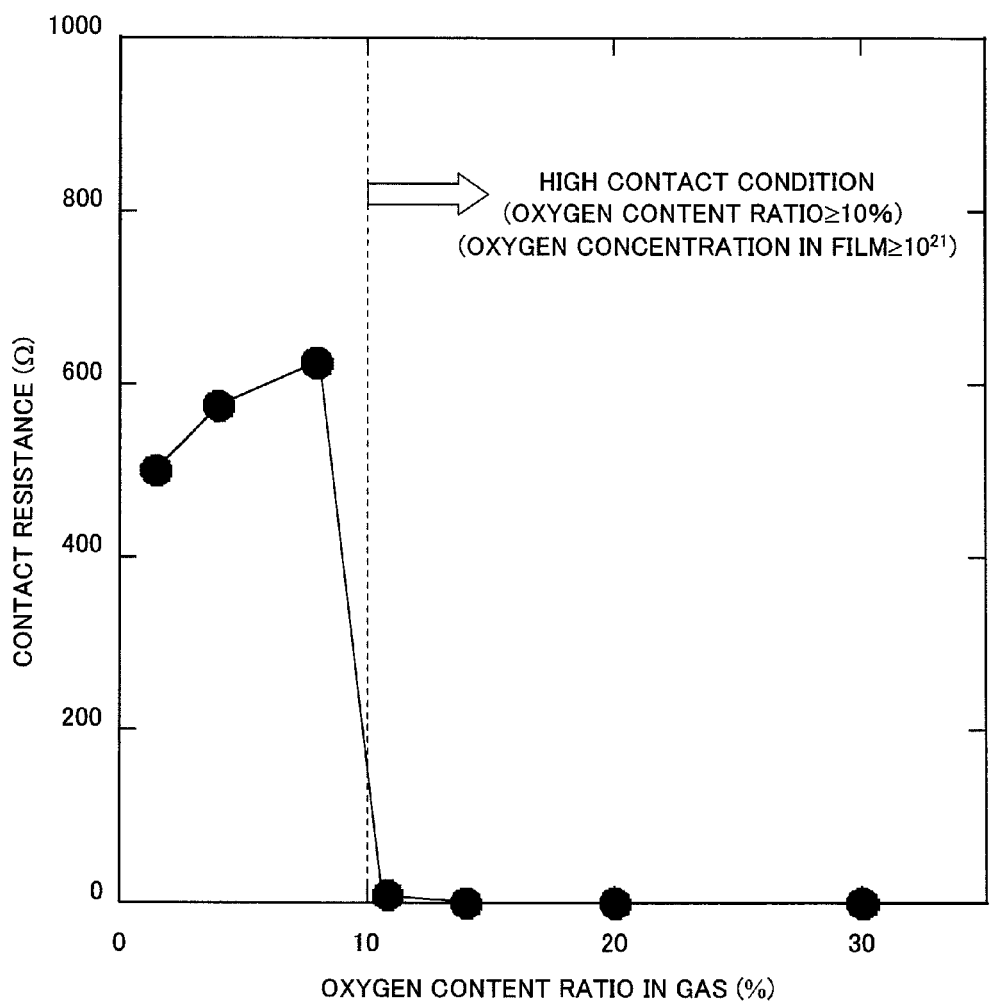
FIG. 1 is a graph illustrating a relation of a contact resistance between an oxide semiconductor and an electrode and an oxygen content ratio in an introduced gas upon depositing the oxide semiconductor (example of using IGZO) used in the present invention.
Figure 2:
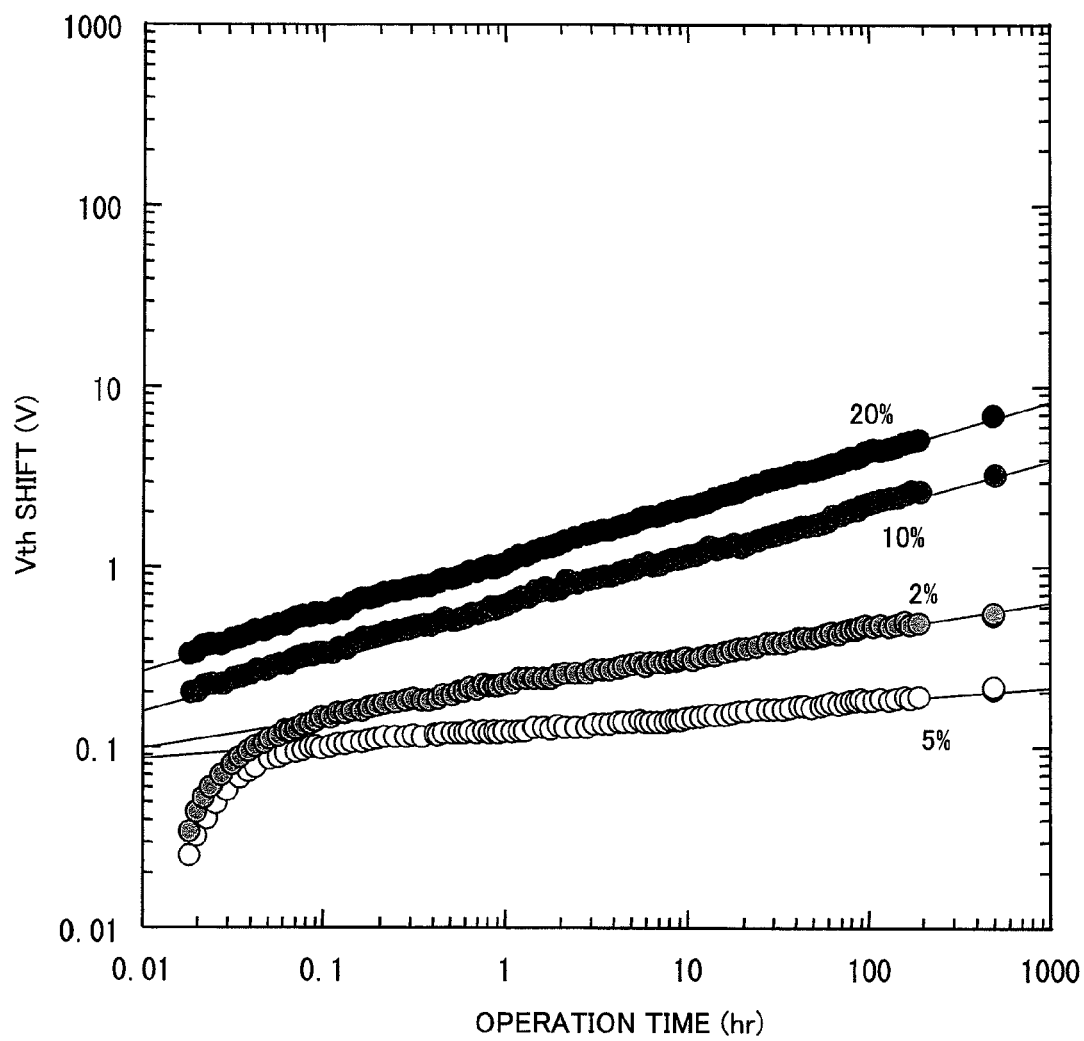
FIG. 2 is a graph illustrating a relation of a threshold potential shift and an oxygen content ratio upon depositing the oxide semiconductor of (example of using IGZO) an oxide semiconductor thin-film transistor used in the present invention.
Figure 3:
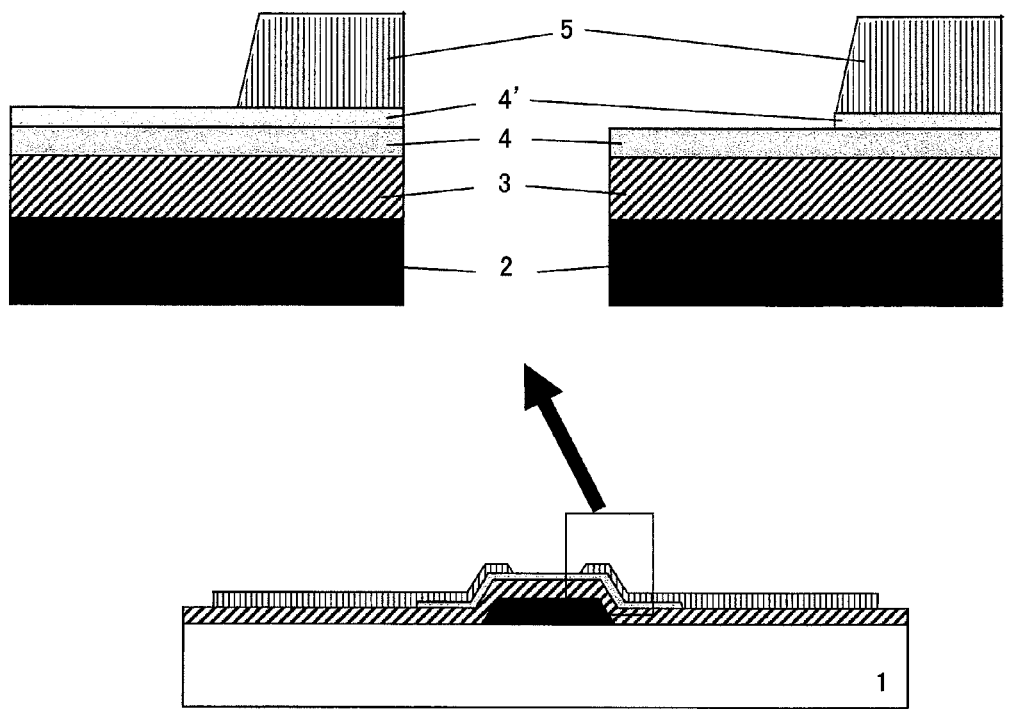
FIG. 3 is a cross-sectional view describing configurations of an oxide semiconductor contact layer and a channel layer used in the present invention.
Figure 4:
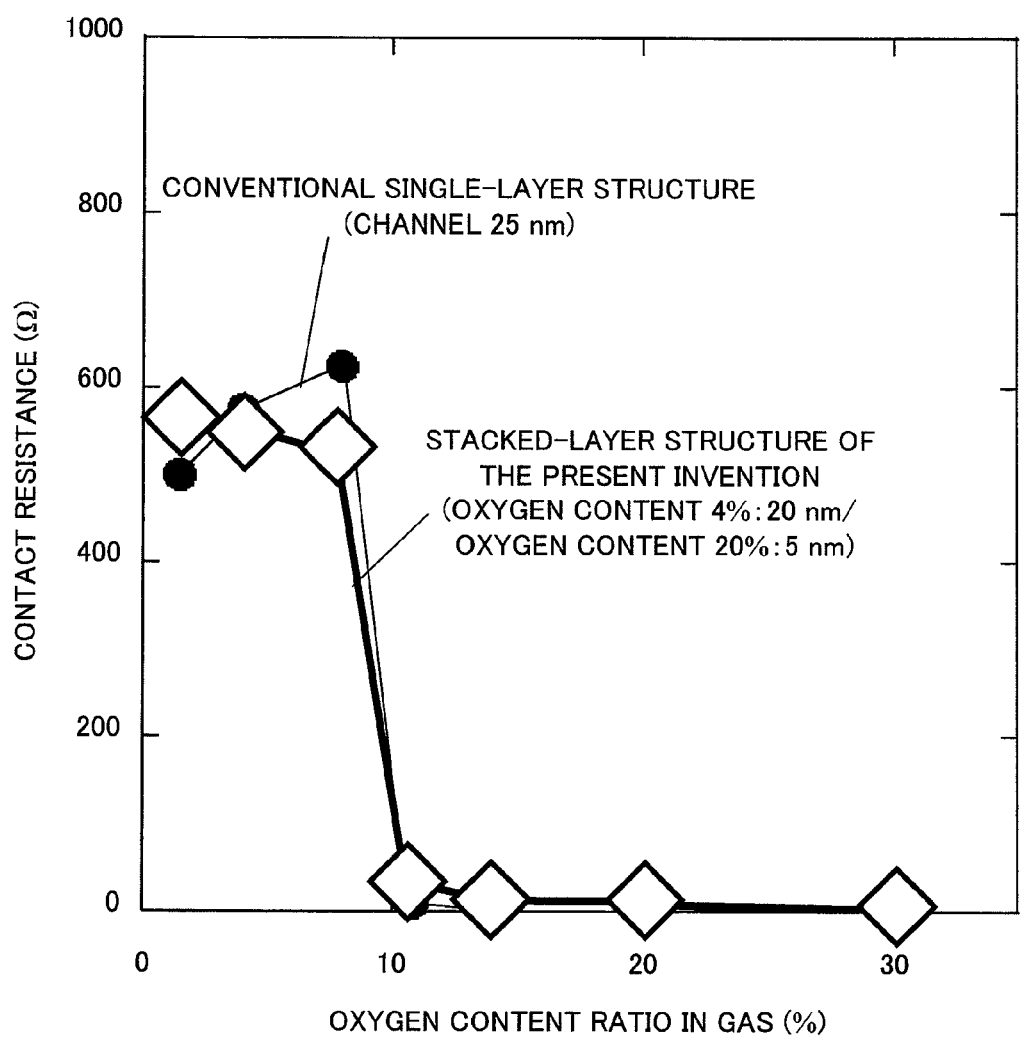
FIG. 4 is a graph illustrating a relation of a contact resistance between an electrode and an oxide semiconductor stacked film (additive oxygen 4%:20 nm/additive oxygen 20%:5 nm) to which the present invention is applied (an oxygen content ratio in the horizontal axis indicates that of the contact layer)
Figure 5:
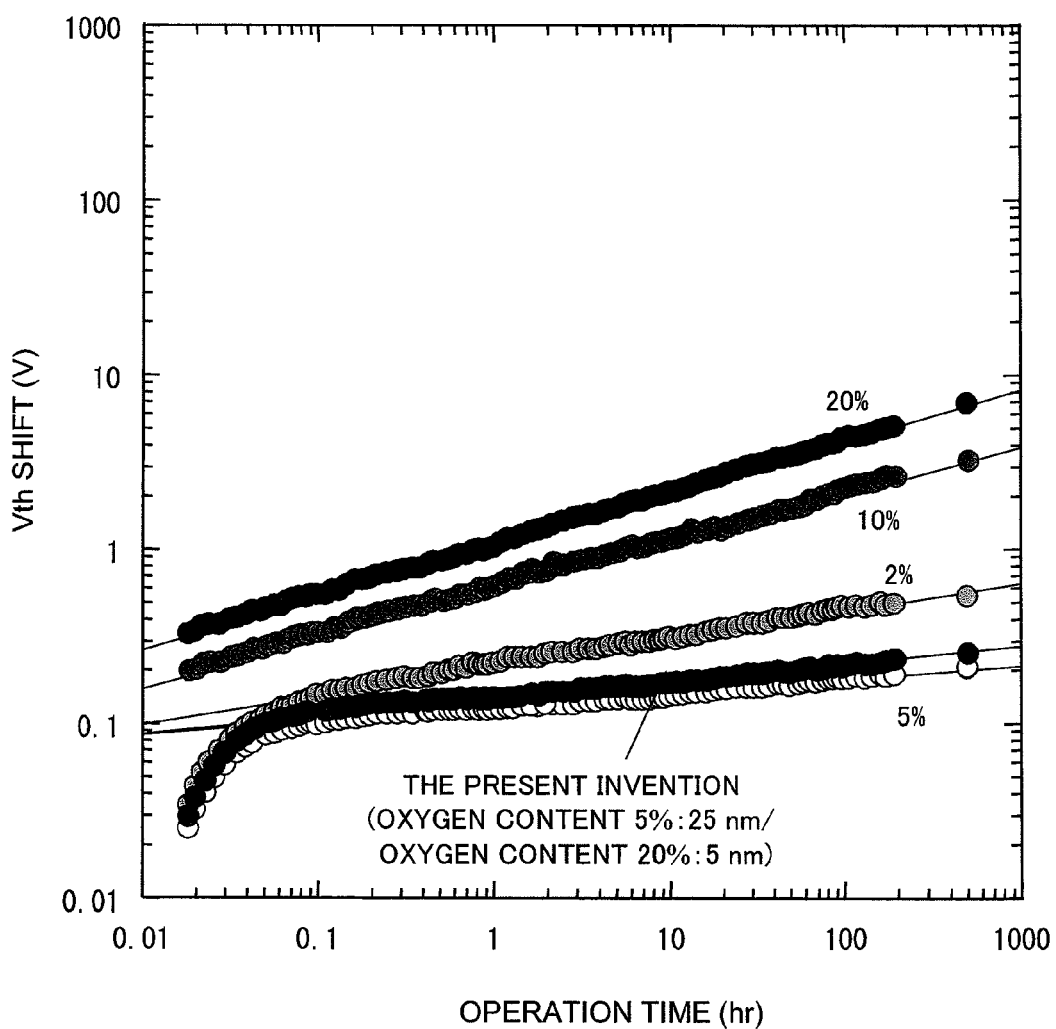
FIG. 5 is a graph illustrating a threshold potential shift of an oxide semiconductor thin-film transistor in which the oxide semiconductor stacked film (additive oxygen 4%:20 nm/additive oxygen 20%:5 nm) according to the method of the present invention is used.
Figure 6:
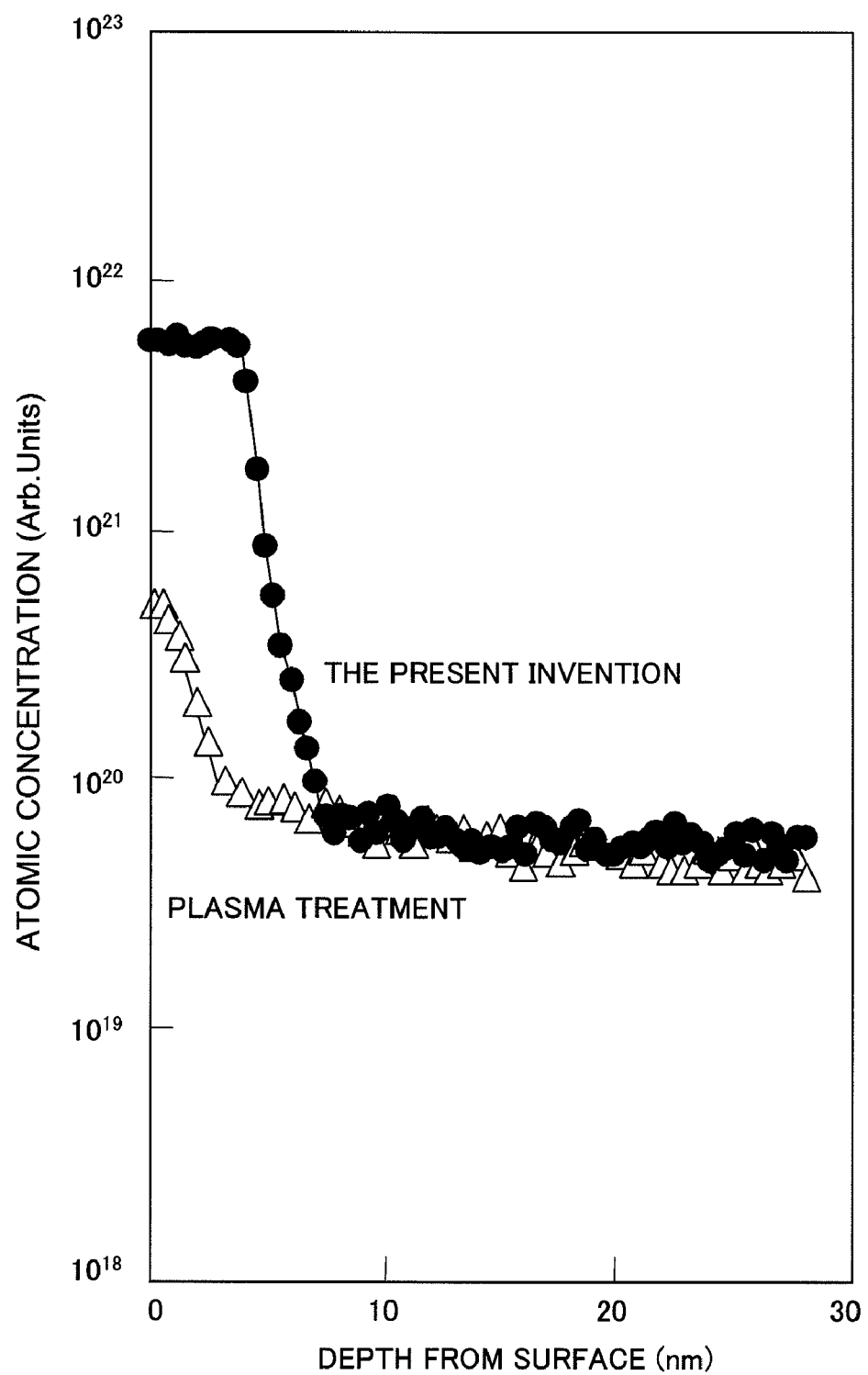
FIG. 6 is a graph of a method of secondary ion mass spectrometer (SIMS) describing a difference in oxygen concentration between a film formed by a conventional plasma method and an oxide semiconductor film formed by the method of the present invention.
Figure 7A:
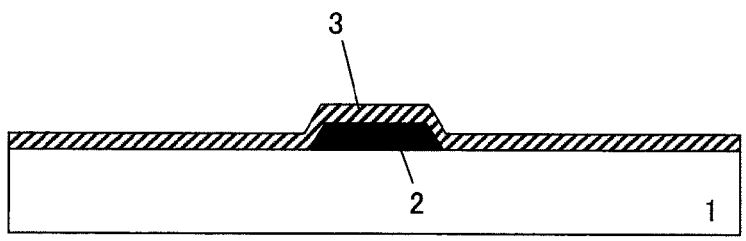
FIGS. 7A-7E are flow diagrams describing a structure of a bottom-gate top-contact oxide semiconductor thin-film transistor according to a first embodiment of the present invention and a method of manufacturing the same.
Figure 7B:
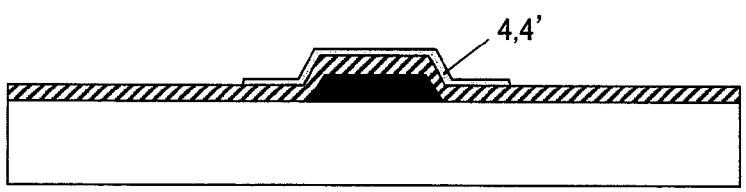
Figure 7C:
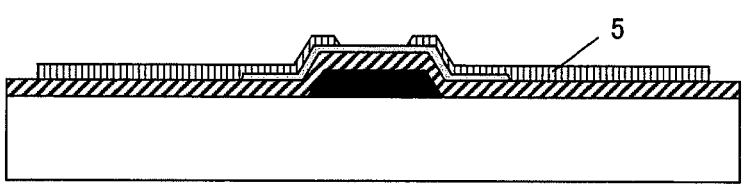
Figure 7D:
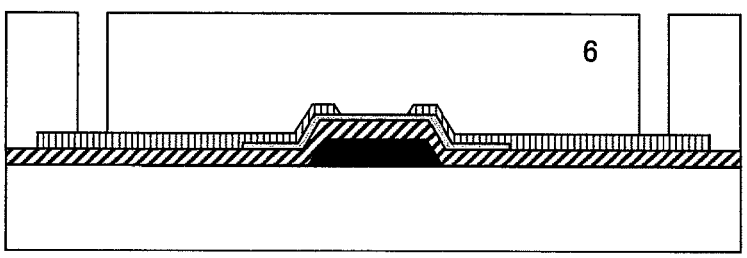
Figure 7E:
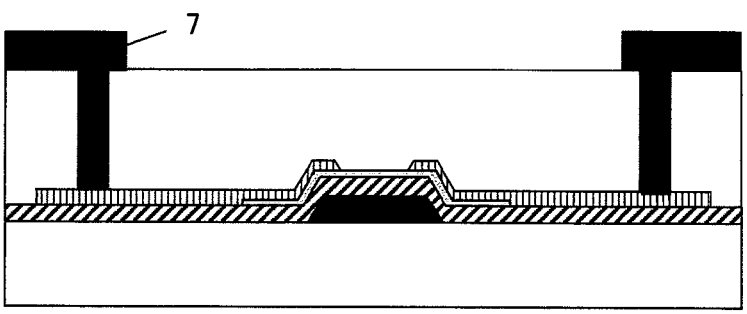
Figure 8:
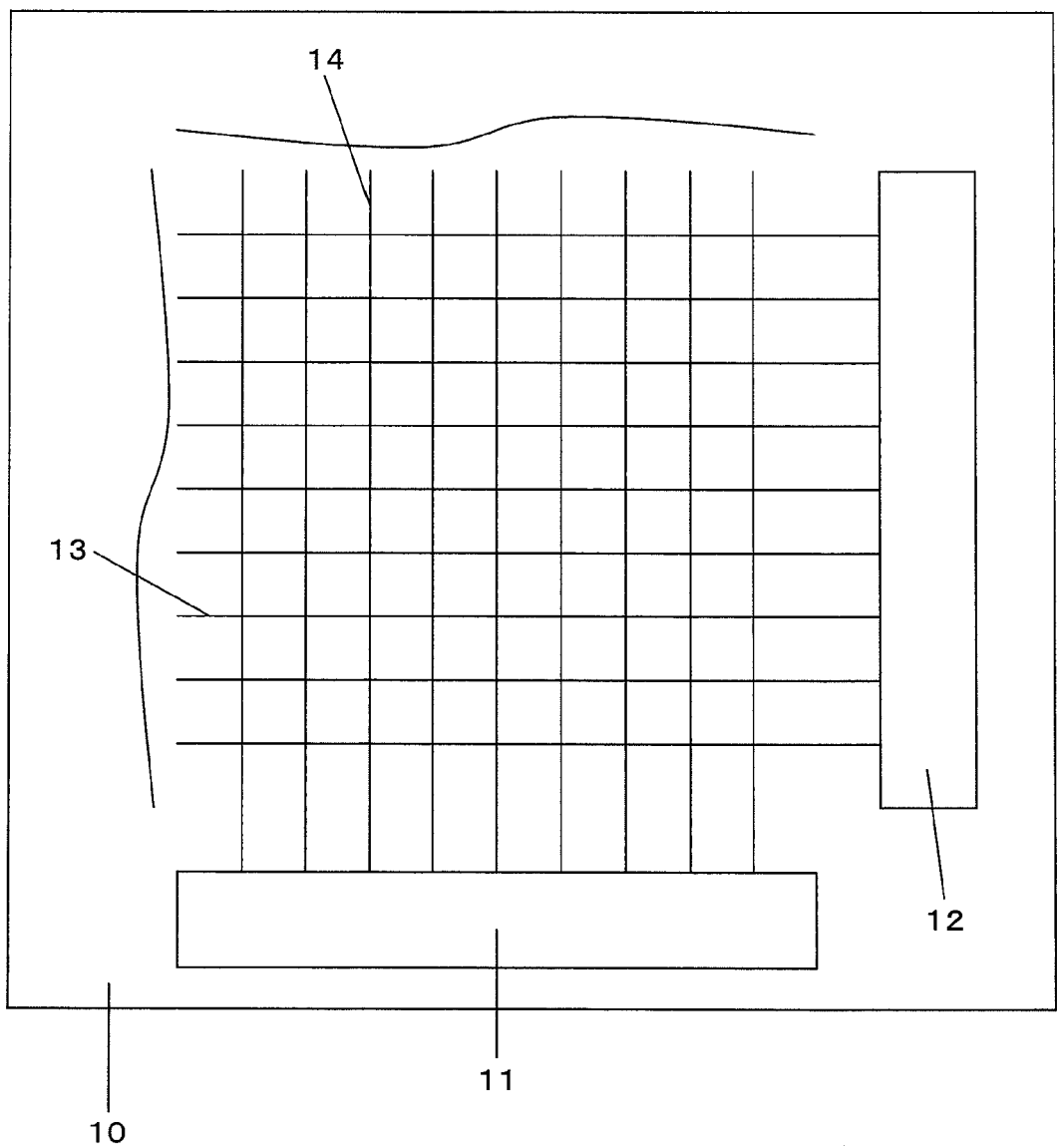
FIG. 8 is a schematic diagram describing a simple configuration of an active-matrix circuit to which the method of the present invention is applied.
Figure 9:
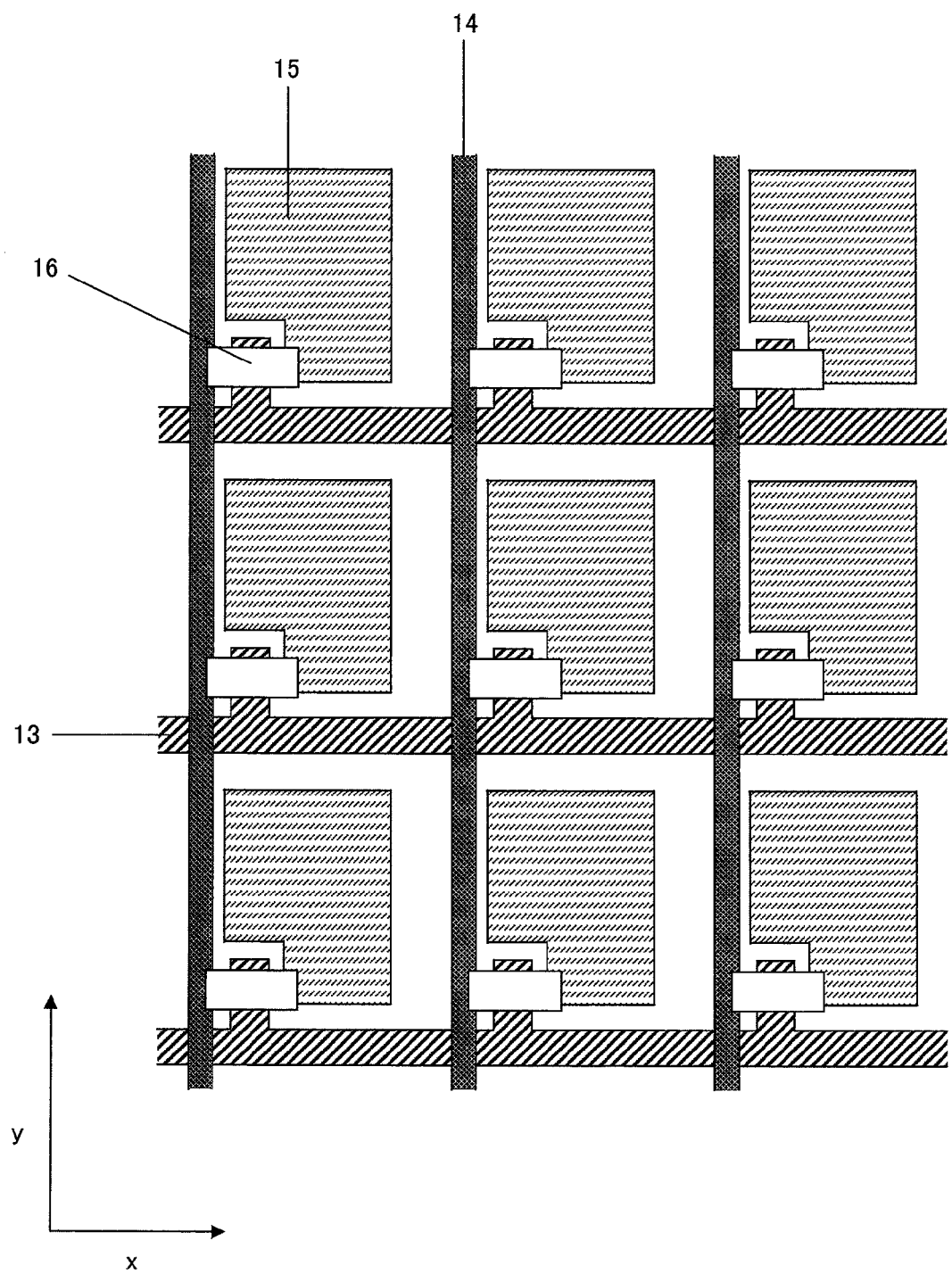
FIG. 9 is a bird's eye view describing a configuration of the active-matrix circuit and the thin-film transistor to which the method of the present invention is applied.
Figure 10A:
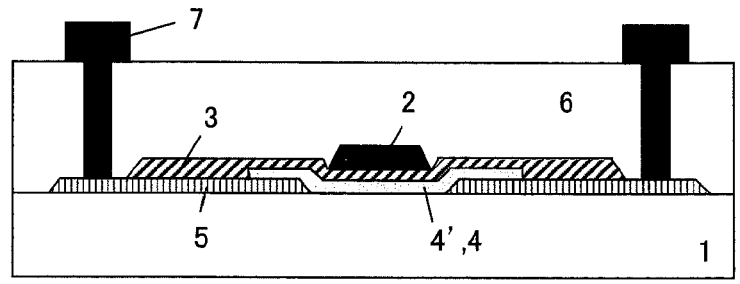
FIGS. 10A-10C illustrate a structure of another oxide semiconductor thin-film transistor to which the method of the present invention is applicable.
Figure 10B:
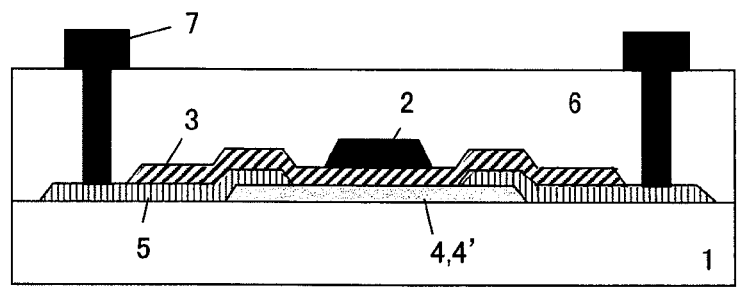
Figure 10C:
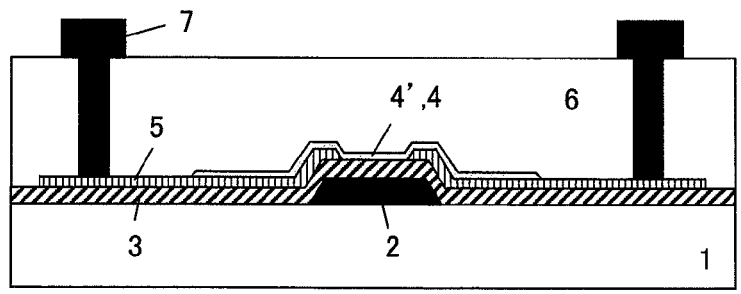
Figure 11A:
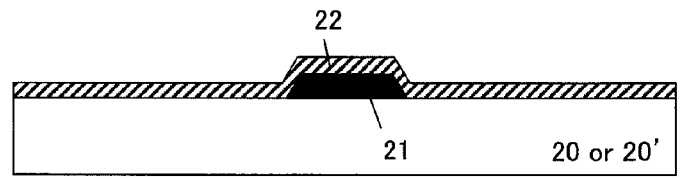
FIGS. 11A-11E are flow diagrams explaining a structure of a write-once thin film memory applying the bottom-gate top-contact oxide semiconductor thin-film transistor according to a second embodiment of the present invention and a method of manufacturing the same.
Figure 11B:
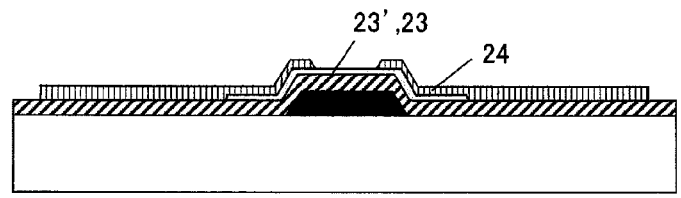
Figure 11C:
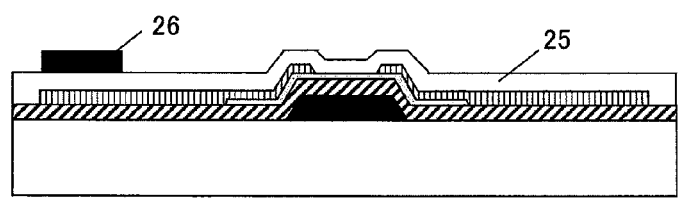
Figure 11D:
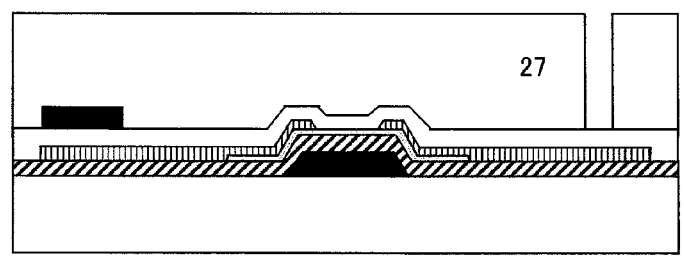
Figure 11E:
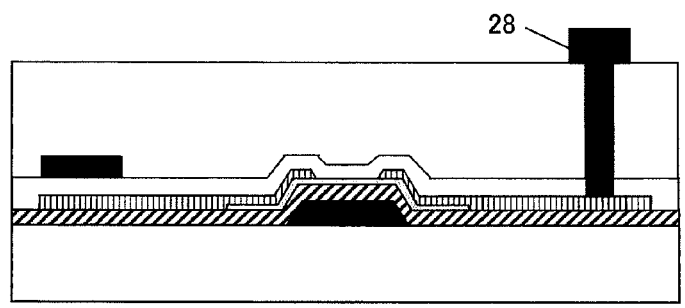

A structure of a thin-film transistor for an image device according to a first embodiment of the present invention, a method of manufacturing the same, and a method of employing the device and method will be described with reference to FIGS. 7A to 10C. FIGS. 7A to 7E illustrate cross-sectional views of a bottom-gate top-contact thin-film transistor and also flow diagrams illustrating one example of a method of manufacturing the transistor. FIGS. 8 and 9 illustrate a simple configuration of an active-matrix circuit for employing the transistor to a device and a schematic view of the active-matrix circuit, respectively. FIG. 10 is a cross-sectional view illustrating a structure of a thin-film transistor having a structure other than the bottom-gate top-contact structure.

First, there is prepared a supporting substrate 1 such as, for example, a glass substrate, a quartz substrate, a sapphire substrate, a resin substrate, or a film. Next, there is formed a stacked film of metal thin films of, for example, Al (aluminum) (250 nm) and Mo (molybdenum) (50 nm) or others on the supporting substrate 1 by a vapor-deposition method, a sputtering method, or others, and a patterning is performed to the stacked film by a liftoff process or an etching process, so that a gate electrode 2 is formed. And then, on an upper layer of the gate electrode 2, there is stacked a gate insulating film 3 formed of, for example, an oxide film or a nitride film such as a silicon oxide film, a silicon nitride film, or others having a thickness of about 100 nm by a sputtering method, a CVD method, a vapor-deposition method, or the like.

And then, there are formed oxide semiconductor channel layers 4 and 4' on the gate insulating film 3 by a vapor-deposition method or a sputtering method with using an IGZO target or a ZTO target, and a patterning is performed to the oxide semiconductor channel layers 4 and 4' by a resist process and an etching technique. At this time, about 25 to 75 nm is preferable for thicknesses of the oxide semiconductor channel layers 4 and 4' when they are used for a current-driving device such as organic EL, and 10 to 25 nm is preferable when they are used for a switching device such as a liquid crystal display. A portion of 5 nm on a surface side of either oxide semiconductor channel layer 4 or 4' to be contacted with a source/drain electrode 5 is deposited with a condition of an oxygen content ratio of 20% or higher upon the deposition, and the deposition is stopped once, then, the rest of the oxide semiconductor layer on the gate insulating film 3 side is deposited with a condition of an oxygen content ratio of 5% or lower upon the deposition, so that a double-layered structure is provided by the conditions of the method of the present invention. At this time, it is considered that an effective oxygen concentration in the oxide semiconductor layer of the portion of 5 nm contacting with the electrode is $10^{19}$ atomic concentration or higher, and that in the rest of the oxide semiconductor layer is lower than $10^{18}$ atomic concentration.

And then, an electrode layer to be the source/drain electrode 5 is formed by a vapor-deposition method, a sputtering method, or others, and a patterning is performed to the electrode layer by a liftoff method or an etching process with using a resist process followed by processes for a passivation film 6 and a wiring 7, so that the bottom-gate top-contact oxide semiconductor thin-film transistor is completed. For the source/drain electrode 5, a transparent conductive film made of ITO, AZO (aluminum-doped zinc oxide), GZO (gallium-doped zinc oxide), or others is used. Note that a multi-layer may be provided by interposing a low-resistance transparent conductive film containing higher-concentration oxygen than that of a normal transparent conductive film (electrode materials described above) between the electrode and the oxide semiconductor layer. Further, in the structure of the contact layer 4', the same effect is obtained also by providing the double-layered structure on the whole surface or providing the contact layer only in a region right below the source/drain electrode 5.

The IGZO thin-film transistor is prototyped by the method of the present invention with using a deposition technique of a magnetron sputtering method. An IGZO channel layer has a thickness of 45 nm, and its deposition conditions are 0.5 Pa (using a mix gas of argon and oxygen with additive oxygen of 4%), an RF power density of 10 W/cm$^2$, a rotation speed of the substrate of 5 rpm, a distance between electrodes of 70 cm, and a target composition of (In$_2$O$_3$: Ga$_2$O$_3$: ZnO=2:2:1). The deposition is stopped once, and the conditions are changed to deposit an IGZO contact layer having a thickness of 5 nm. The deposition conditions are the same with those of the channel layer other than the additive oxygen of 20%. Also, a grading layer may be formed by sequentially depositing the contact layer as sequentially and gradedly changing the additive amount of oxygen without stopping the deposition. The stacked film of Al (250 nm)/Mo (50 nm) is used for the gate electrode, and the sputtered ITO transparent conductive film of 150 nm is used for the source/drain electrode. A threshold potential shift of the thin-film transistor has been examined in an accelerate condition. As a result, compared with the threshold potential shift of about 4 V per 100 hours when the IGZO channel layer is formed with the oxygen content ratio of about 20% which achieves a contact resistance of about 0.2Ω, the threshold potential shift has been suppressed to be 0.2 V or lower per 100 hours when the thin-film transistor is formed of the IGZO stacked film of the IGZO contact layer (5 nm) formed on the source/drain electrode side with the oxygen content ratio of about 20% and the IGZO channel layer (45 nm) formed on the gate insulating film side with the oxygen content ratio of about 3% by the method of the present invention. Also as to other basic characteristics, a mobility of 50 cm$^2$/Vs or larger and an On/Off characteristic of $10^6$ or higher, which are good values have been obtained. Therefore, the thin-film transistor has sufficient properties to be used for a transistor for driving an organic EL display or a liquid crystal display. When a thin-film transistor array as illustrated in FIGS. 8 and 9 has been actually prototyped and used as a driving circuit for organic EL, good operations have been possible. Further, the same film-property controls are also possible in all of the thin-film transistors of a bottom-contact top-gate structure as illustrated in FIG. 10, a bottom-contact bottom-gate structure, and a top-contact top-gate structure, except for differences in the procedure of the oxide semiconductor deposition, and therefore, almost the same device property is obtained.

FIG. 8 is a configuration diagram upon practicing a semiconductor device according to the present invention. Elements each having the oxide semiconductor thin-film transistor according to the present invention as a component are arranged on a supporting substrate 10 in array. In addition to using the oxide semiconductor transistor to which the present invention is applied for a transistor for switching each element in the array or driving the element, the oxide semiconductor thin-film transistor may be used for a transistor configuring a gate-line driving circuit 12 transmitting signals to a gate line 13 connected to the gate electrode 2 of the oxide semiconductor thin-film transistor or configuring a data-line driving circuit 11 transmitting signals to a data line 14 connected to the source/drain electrode 5 of the oxide semiconductor thin-film transistor. In this case, it is possible to parallely form the oxide semiconductor thin-film transistors for each element and the oxide semiconductor thin-film transistors in the data-line driving circuit 11 or the gate-line driving circuit 12. Also, since the oxide semiconductor thin-film transistor can be formed at the room temperature, a configuration that the substrate 10 is a so-called flexible substrate such as a resin substrate or a film is also applicable.

When the array is used in an active-matrix liquid crystal display device, each element has a configuration, for example, as illustrated in FIG. 9. When a scan signal is supplied to the gate line 13, the oxide semiconductor thin-film transistor is turned on, so that an image signal from the data line 14 is supplied to a pixel electrode 15 via the turned-on oxide semiconductor thin-film transistor. Note that the gate lines 13 are parallely provided in a y direction in FIG. 9, the data lines 14 are parallely provided in an x direction in FIG. 9, and the pixel electrode 15 is arranged in a region (pixel region) surrounded by paired gate lines 13 adjacent to each other and paired data (drain) lines 14 adjacent to each other. In this case, for example, the data line 14 is electrically connected to the source electrode, and the pixel electrode 15 is electrically connected to the drain electrode. Alternately, the data line 14 may function as the source electrode, and the pixel electrode 15 may function as the drain electrode. Also, the array may be used for not only the liquid crystal display device but also an organic EL display or others. In this case, the oxide semiconductor thin-film transistor according to the present invention is applied to a transistor configuring a pixel circuit. Further, as described in a second embodiment below, the array may be used as a memory element, and the oxide semiconductor thin-film transistor according to the present invention may be used as a select transistor.

Second Embodiment

Figure 12:
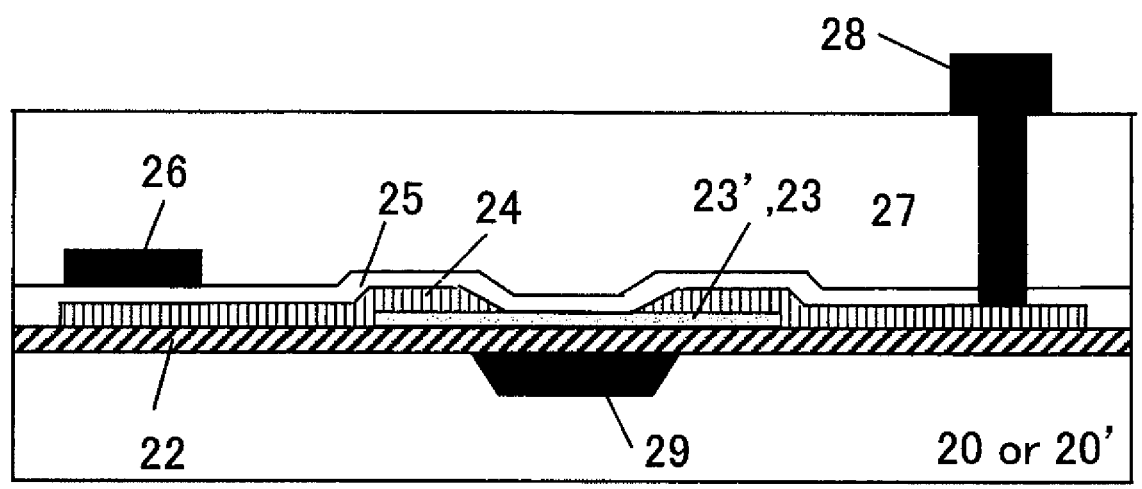
FIG. 12 is a cross-sectional view describing another type of a bottom-gate top-contact oxide semiconductor thin-film transistor used to the thin-film memory of the second embodiment of the present invention.
Figure 13A:
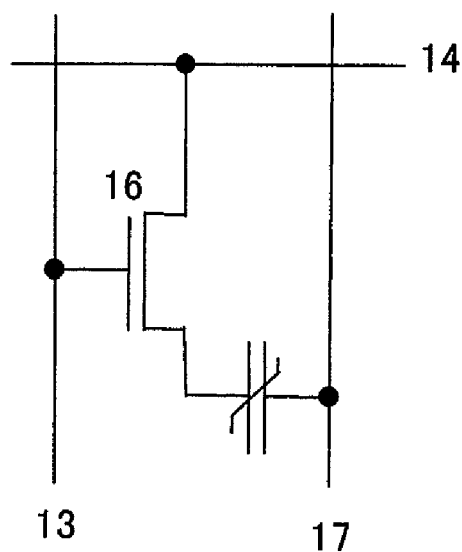
FIG. 13A is a circuit diagram illustrating a memory configuration of the second embodiment of the present invention.
Figure 13B:
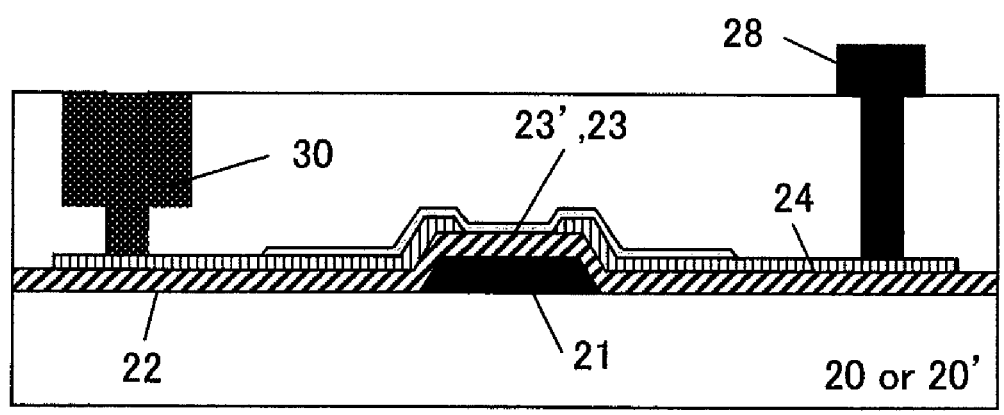
FIG. 13B is a cross-sectional view describing one example of integrating the oxide semiconductor thin film memory and a display-driving oxide semiconductor thin-film transistor of the second embodiment of the present invention.
Figure 14A:
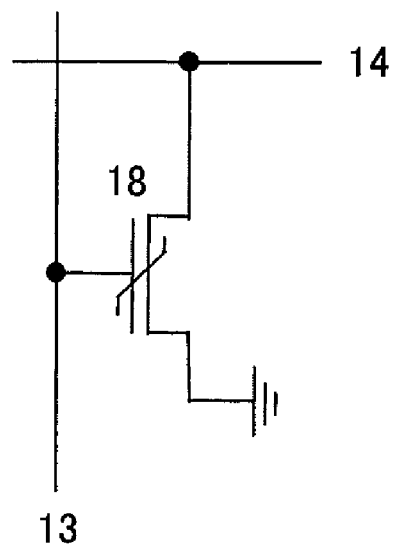
FIG. 14A is a circuit diagram illustrating a memory configuration of the second embodiment of the present invention.
Figure 14B:
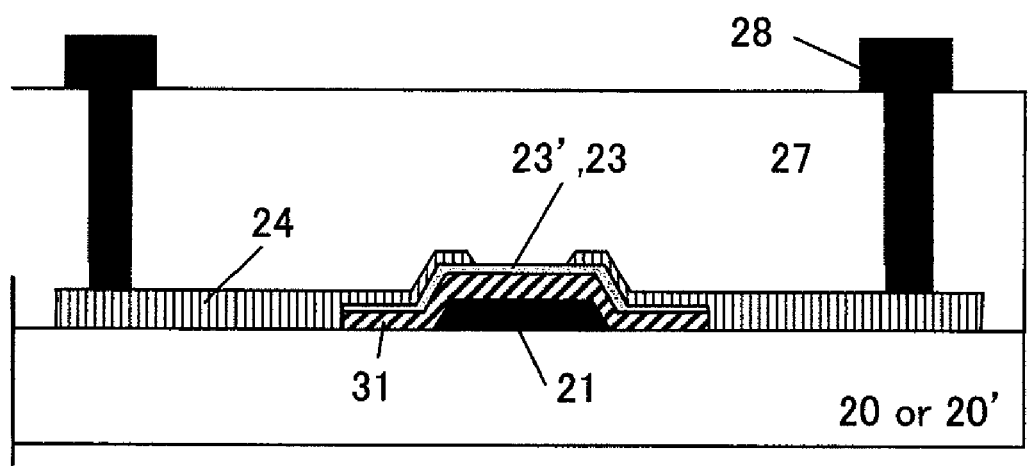
FIG. 14B is a cross-sectional view describing one example of integrating the oxide semiconductor thin film memory of the second embodiment of the present invention by multi-layering.
Figure 15A:
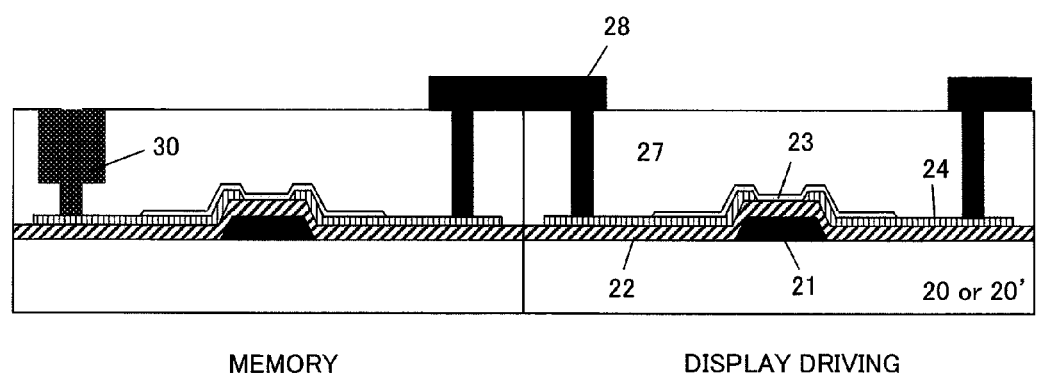
FIGS. 15A and 15B are cross-sectional views illustrating one example of integrating the oxide semiconductor thin film memory and the display-driving oxide semiconductor thin-film transistor using the bottom-gate top-contact oxide semiconductor thin-film transistor according to the method of the present invention.
Figure 15B:
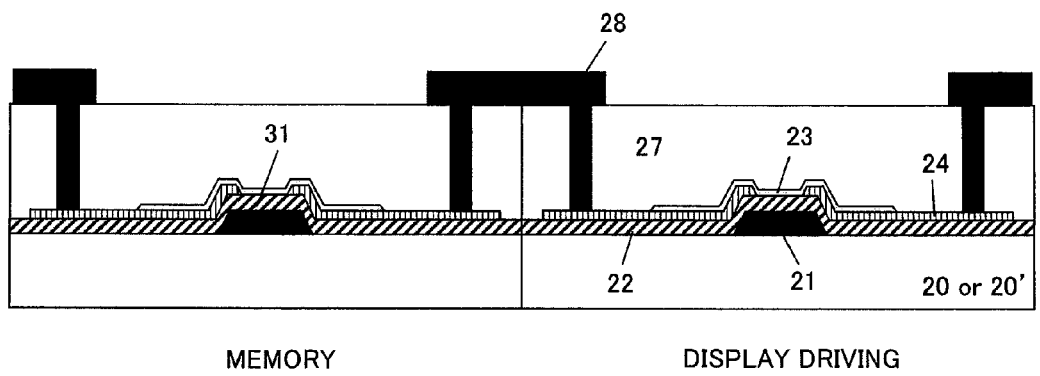
Figure 16:
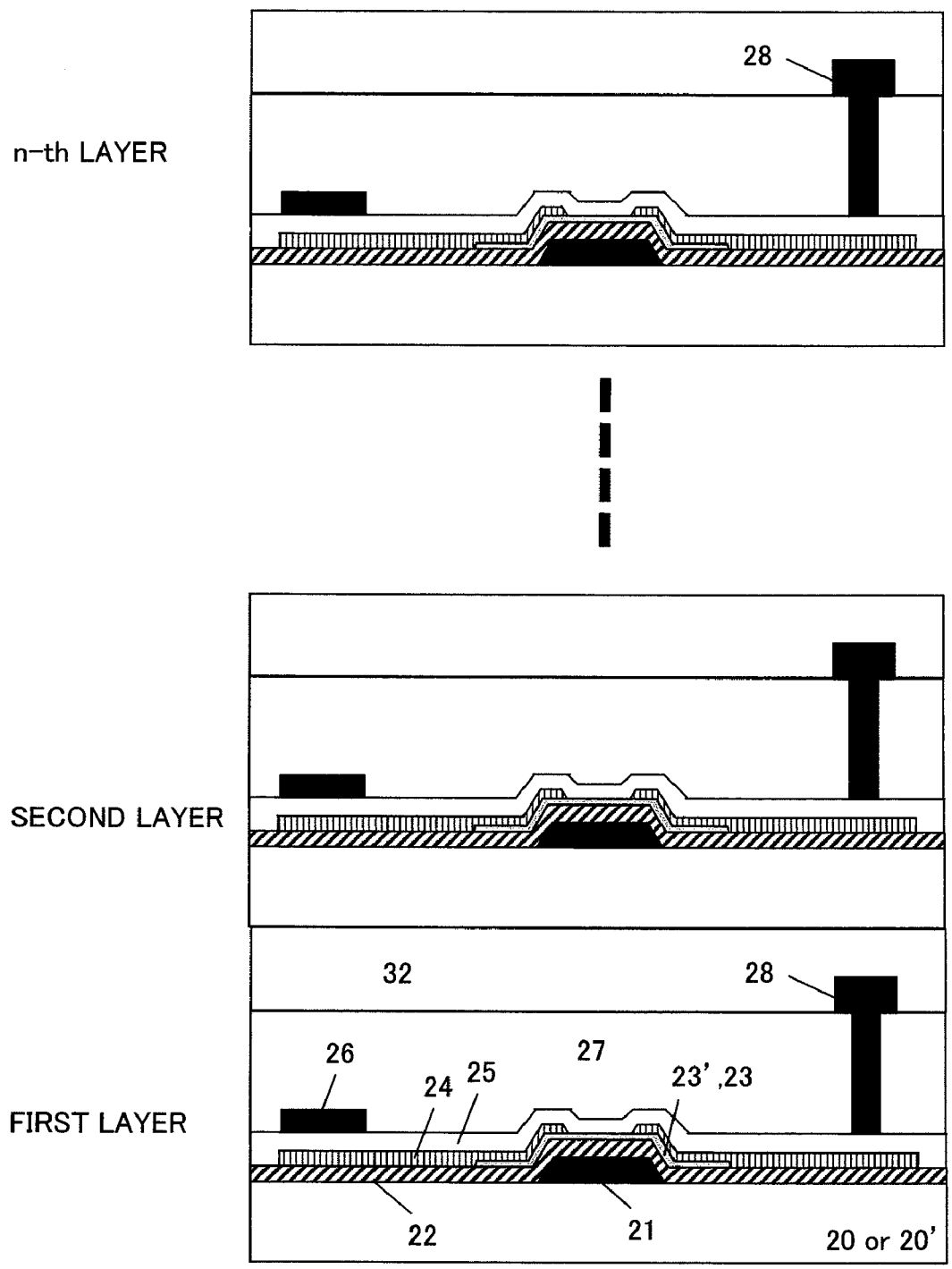
FIG. 16 is a cross-sectional view illustrating the oxide semiconductor memory being multilayered and integrated.
Figure 17A:
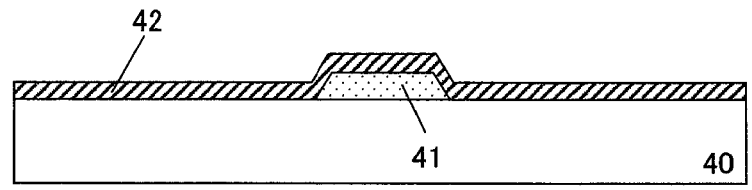
Figure 17B:
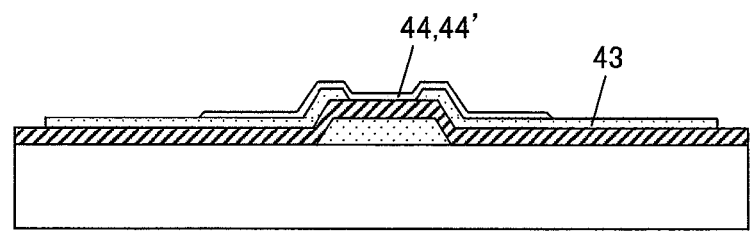
Figure 17C:
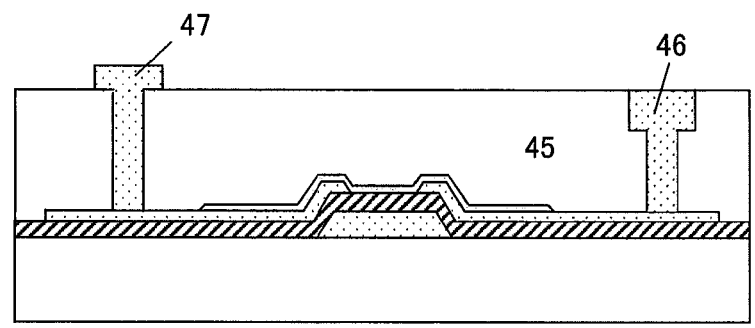
Figure 17D:
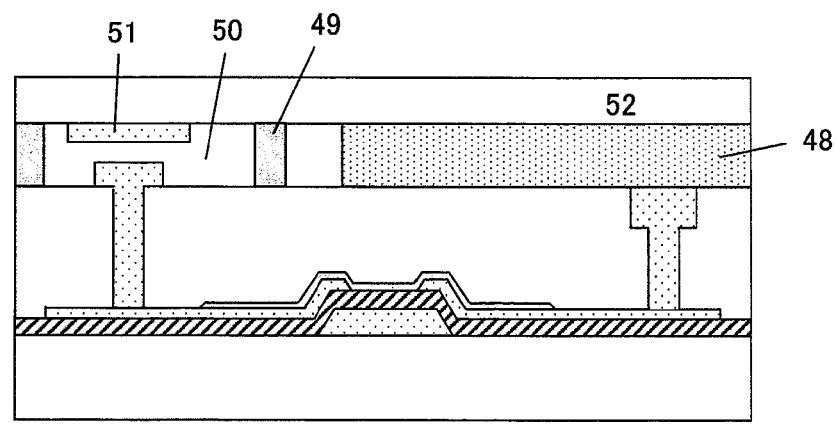

A structure of an oxide semiconductor thin film memory according to a second embodiment of the present invention and a method of manufacturing the same will be described with reference to FIGS. 11A to 16. FIGS. 11A-11E and 12 illustrate cross-sectional views of an oxide semiconductor thin film memory using a bottom-gate top-contact thin-film transistor according to the present invention and flow diagrams illustrating one example of a manufacturing process of the memory. FIG. 13A illustrates a memory structure including a capacitor on the drain side and FIG. 14A illustrates a memory configuration for performing a memory operation by a change of a gate capacitance, and FIG. 13B and FIG. 14B illustrate cross-sectional views of these memory devices, respectively. FIGS. 15A and 15B are cross-sectional views each illustrating one example of integrating a display-driving transistor using the bottom-gate top-contact thin-film transistor according to the method of the present invention and the oxide semiconductor thin-film memory, and FIG. 16 is a cross-sectional view illustrating a state in which the oxide semiconductor is multilayered and integrated.

First, there is prepared a semiconductor single-crystal substrate 20 such as a silicon substrate or a transparent substrate 20' such as a quartz substrate, a sapphire substrate, a resin substrate, or a film. On these substrates, there is formed a gate electrode 21 made of Al or others by a vapor-deposition method, a sputtering method, a resist process with an etching process, or a liftoff method. In the gate electrode 21, if the substrate is a single-crystal silicon substrate, a high-concentration p-type Si gate electrode 29 may be formed by ion implantation or the like as illustrated in FIG. 12. In this case, a thermal oxide film having high quality can be used as a gate insulating film 22, so that there is an advantage of providing a device itself having a form with less surface unevenness. And then, an $SiO_2$ film of the gate insulating film 22 is formed by a CVD method, a sputtering method, a vapor-deposition method, or others. For using the gate insulating film 22 for a memory, about 10 to 50 nm is preferable for its thickness. And then, there are formed oxide semiconductor layers 23 and 23' made of IGZO or ZTO having a multilayered structure including a high-concentration oxygen additive contact layer 23' according to the present invention by a sputtering method or a vapor-deposition method. For example, the IGZO film of 2 to 10 nm is used as the main channel layer 23 by a magnetron sputtering method with using mixed gas plasma of argon/oxygen with the oxygen content ratio of 3%, and the sputtered IGZO film of 3 to 5 nm is used as the contact layer 23' by plasma of argon/oxygen with the oxygen content ratio of 18% on the main channel layer 23. The deposition conditions of the IGZO are the same with those of the first embodiment other than the oxygen content ratio. When a property as a memory is considered, an available thickness of complete depletion is 5 to 15 nm, and on the other hand, a thickness of 3 nm or thicker is required for obtaining a good contact to a metal material as the contact layer 23', and therefore, it is required to select a thickness combination with taking these thicknesses into consideration. Also, as to the structure of the contact layer 23', the same effect is obtained not only by forming it on the whole surface but also by forming it on only the region right below the source/drain electrode 24.

And then, the source/drain electrode 24 layer is formed by a vapor-deposition method or a sputtering method, and the source/drain electrode 24 is patterned by a resist process with an etching or a liftoff method. Further, there is formed a resistive film 25 formed of a silicon oxide film/silicon nitride film on the source/drain electrode 24, and there is formed a wiring layer 26 on a position adjacent to the resistive film 25. By properly setting thicknesses of the resistive film 25 and the wiring layer 26, the resistive film 25 is destroyed to be electrically conductive by applying a relatively high voltage at an initial stage, and therefore, it is possible to achieve a write-once memory using the destruction. Also, as illustrated in FIGS. 13B and 14B, by forming a capacitor layer 30 having a sufficient capacitance or forming a ferroelectric gate insulating film 31 in the memory, the memory can be used as a rewritable memory. In this case, compared with using a difference of current values induced by hysteresis as a memory when the capacitor is provided on the drain electrode side as illustrated in FIG. 13A, a difference of threshold potentials is used as the memory when a ferroelectric or others is used for the gate insulating film as illustrated in FIG. 14A.

Further, as illustrated in FIG. 15, by using a transparent conductive film made of ITO, AZO, GZO, or others as the electrode material, memory device integration is possible to an FPD such as a liquid crystal display or an organic EL display. In this case, if it is assumed that a memory of 1 bit per 1 pixel can be formed, it is possible to superimpose a memory of 256 kilobits at lowest or larger on a full high vision display. There are further formed an interlayer insulating film 28 formed of a polyimide or SOG (spin on glass) layer, a through-via, and a wiring layer, so that the memory array is completed. Since the main technique of the present invention is the deposition technique, these memory arrays (FIG. 16 illustrates an example of the write-once memory) are further stacked to the upper-layer region as illustrated in FIG. 16, so that it is possible to expand the memory capacitance per unit area and/or integrate circuits. Note that a basic configuration of a circuit when using the memory arrays is almost the same with that of FIGS. 8 and 9 and that of FIGS. 13A and 14A described in the first embodiment.

A current-voltage property of a single cell of an IGZO thin-film transistor actually manufactured by the method of the present invention has been studied, and its result has shown good transistor properties with a subthreshold swing of 62 mV/dec and a mobility of 20 $cm^2$/Vs which are not inferior to those of crystal-silicon semiconductor. Since the threshold potential of the transistor is almost close to 0 V, memory operation at a very low voltage (1.5 V or lower) with a very low power consumption is possible by also using the good subthreshold swing. Note that the thin-film transistor of the bottom-gate top-contact type has been described here. However, almost the same effect is obtained also in any thin-film transistor structure of a top-gate bottom-contact type, a top-gate top-contact type, and a bottom-gate bottom-contact type.

Also, since IGZO and ZTO are transparent oxide materials, they are used as a thin-film transistor such that a silicon oxide film is used for the gate insulating film, and a transparent conductive film made of ITO, AZO, GZO, or others is used for the electrode material, so that a almost transparent circuit can be formed. For example, when forming an antenna unit by using the ITO transparent conductive film and forming an RFID configured with a power-supply circuit, a resonant circuit (using a Schottky diode of ZTO semiconductor), and a digital circuit to which the write-once memory illustrated in FIG. 11 is applied with using the ZTO thin-film transistor by the method of gradedly changing the oxygen content ratio of the contact layer (about 5 nm) from 20% to 5% from the electrode side of the present invention, good properties including a mobility of about 10 to 50 $cm^2$/Vs, an On/Off ratio $\geq 10^7$, and a subthreshold swing of 70 mV/dec have been shown, and transmission and reception over 13.56 MHz has been confirmed. More particularly, since this RFID tag is configured with materials having very high transmittance of 90% or higher which is a feature of this RFID tag, the tag is not a type in which structures of silicon chips, an antenna made of a metal, and others are apparent as conventional RFID tags, and therefore, it is possible to install the tag in later processes without disturbing a design shown/printed on a film or a card.

Third Embodiment

A structure of a touch panel using an oxide semiconductor thin-film transistor according to a third embodiment of the present invention and a method of manufacturing the same will be described with reference to FIGS. 17A-17D and 18. FIGS. 17A-17D are cross-sectional views of an oxide semiconductor touch panel (touch sensor) according to the present invention and flow diagrams illustrating one example of a manufacturing process of the oxide semiconductor touch panel. FIG. 18 is a cross-sectional view illustrating one example in which the oxide semiconductor touch panel and the oxide semiconductor transistor according to the present invention are integrated as a back-emission type organic EL display.

Although a basic structure of the touch panel according to the present invention is almost the same with that of the oxide semiconductor thin-film transistor array described in the second embodiment, no surface unevenness is desirable in a surface of the structure of the touch panel from points of view of durability and operability for its usage. Therefore, as illustrated in FIGS. 17A-17D, first, there is formed a bottom-gate bottom-contact thin-film transistor by the method of the present invention on a transparent substrate 40 such as a glass substrate or others, and then, there is attached a top panel 52 having a floating electrode 51 facing the thin-film transistor with providing an air gap 50 so as to interpose a spacer 49, so that a capacitive touch panel is provided. In a configuration of a thin-film transistor channel layer 44 and a contact layer 44' by the method of the present invention, the contact layer 44' of 5 nm has a double-layered structure of an IGZO layer (in a thickness of 3 nm from the electrode side) formed with the oxygen content ratio of 20% and an IGZO layer (in a thickness of 2 nm from the channel side) formed with the oxygen content ratio of 10% by a sputtering method, and the channel layer 44 has an IGZO layer (35 nm) formed with the oxygen content ratio of 4% by a sputtering method, so that an IGZO oxide semiconductor layer having a triple-layered structure in total is provided. By forming the touch panel with using a transparent conductive film made of ITO, AZO, GZO, or others as the electrode material, the touch panel being almost transparent is completed. By attaching the touch panel to a surface of a liquid crystal panel, an organic EL panel, or others, the touch panel operates as a touch sensor of an active matrix type in response to changes of the drain capacitance.

FIG. 18 illustrates one example of an integration structure as a bottom-emission type organic EL. By the technique of the present invention, it is possible to achieve a highly accurate position detection of about 600 dpi with using the thin-film transistor array as maintaining a transmittance of about 80%. While a method of capacitance detection using the drain-capacitance change has been described here, the method is substitutable with a gate-capacitance reference type using a floating electrode facing a gate electrode or a capacitance detection using the floating electrode, and further, a technique such as a resistive-film detection generally used or others. Their circuit configurations are almost the same with those described in FIGS. 8, 9, 13A-13B, and 14A-14B.

In the foregoing, the invention made by the inventors has been concretely described based on the embodiments. However, it is needless to say that the present invention is not limited to the foregoing embodiments and various modifications and alterations can be made within the scope of the present invention.

What is claimed is:

1. An oxide semiconductor device comprising an oxide semiconductor layer and first and second electrodes contacting a first surface of the oxide semiconductor layer,
   wherein the oxide semiconductor layer includes:
      a first layer having a substantially uniform first oxygen-content concentration; and
      a second layer provided between the first and second electrodes and the first layer such that an upper surface of the second layer contacts bottom surfaces of the first and second electrodes, and having a substantially uniform second oxygen-content concentration, and
   wherein the second oxygen-content concentration is higher than the first oxygen-content concentration.

2. The oxide semiconductor device according to claim 1, wherein
   the second layer has a thickness of 3 nm or larger.

3. The oxide semiconductor device according to claim 1, wherein
   the second oxygen-content concentration is $10^{21}$ atomic concentration or higher, and
   the first oxygen-content concentration is below $10^{21}$ atomic concentration.

4. The oxide semiconductor device according to claim 1, wherein
   there is a 10 times or more difference between the first oxygen-content concentration and the second oxygen-content concentration.

5. The oxide semiconductor device according to claim 1, wherein
   the oxide semiconductor layer includes one of zinc oxide (ZnO), indium gallium zinc oxide (IGZO), zinc tin oxide (ZTO), and zinc indium oxide (ZIO).

6. The oxide semiconductor device according to claim 1, wherein
   a third layer, in which a difference in the oxygen concentrations relative to the first layer and the second layer is gradedly decreased, is provided between the first layer and the second layer.

7. The oxide semiconductor device according to claim 1, wherein
   a layer having a substantially uniform oxygen-content concentration within a range of the oxygen-content concentration of the first layer and the oxygen-content concentration of the second layer is provided between the first layer and the second layer.

8. The oxide semiconductor device according to claim 1, wherein
   each of the first and second electrodes comprises a plurality of layers including a transparent conductive film contacting the oxide semiconductor layer, the transparent conductive film having a lower conductivity than a conductivity of a second layer of the first and second electrodes not contacting the oxide semiconductor layer.

9. The oxide semiconductor device according to claim 1, wherein
   a transistor of a bottom-gate top-contact type or a top-gate bottom-contact type is configured having:
      a gate electrode provided on a second surface of the oxide semiconductor layer with an interposing gate insulating film; and
      a source electrode and a drain electrode contacting the first surface of the oxide semiconductor layer.

10. An active matrix substrate including the oxide semiconductor device according to claim 9, wherein
　a plurality of gate lines and a plurality of data lines are provided on a substrate, and
　a transistor as aforesaid is arranged in each pixel arranged in the matrix at intersections of the plurality of gate lines and the plurality of data lines.

11. The oxide semiconductor device according to claim 1, wherein
　a transistor of a top-gate top-contact type or a bottom-gate bottom-contact type is configured having:
　　a gate electrode provided on a second surface of the oxide semiconductor layer with an interposing gate insulating film; and
　　a source electrode and a drain electrode contacting the first surface of the oxide semiconductor layer.

12. An active matrix substrate including the oxide semiconductor device according to claim 11, wherein
　a plurality of gate lines and a plurality of data lines are provided on a substrate, and
　a transistor as aforesaid is arranged in each pixel arranged in the matrix at intersections of the plurality of gate lines and the plurality of data lines.

* * * * *